United States Patent
He et al.

(10) Patent No.: US 10,687,440 B1
(45) Date of Patent: Jun. 16, 2020

(54) MULTI-RADIAL-ZONE VARYING BLADE DENSITY FAN SYSTEM

(71) Applicant: Dell Products L.P., Round Rock, TX (US)

(72) Inventors: Qinghong He, Austin, TX (US); Travis Christian North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/256,631

(22) Filed: Jan. 24, 2019

(51) Int. Cl.
*H05K 7/20* (2006.01)
*F04D 29/58* (2006.01)
*F04D 29/60* (2006.01)
*F04D 29/30* (2006.01)
*F04D 29/28* (2006.01)

(52) U.S. Cl.
CPC ....... *H05K 7/20172* (2013.01); *F04D 29/281* (2013.01); *F04D 29/30* (2013.01); *F04D 29/584* (2013.01); *F04D 29/601* (2013.01)

(58) Field of Classification Search
CPC .... F04D 29/666; F04D 29/281; F04D 29/324; F04D 29/284; F04D 29/30; F04D 29/384; F04D 29/283; F04D 29/544; F04D 29/282; F04D 29/4206; F04D 17/04; F04D 29/388; F04D 29/584; F04D 29/604; F04D 29/44; H05K 7/20172; H05K 7/20145; H05K 1/0203
See application file for complete search history.

(56) References Cited

U.S. PATENT DOCUMENTS

| | | | | |
|---|---|---|---|---|
| 850,609 | A * | 4/1907 | Wakefield | F04D 29/30 416/183 |
| 912,362 | A * | 2/1909 | Capel | F04D 29/281 416/183 |
| 1,150,278 | A * | 8/1915 | Lepley | F04D 29/281 416/183 |
| 1,805,055 | A * | 5/1931 | Stoetzel | F04D 29/281 416/223 R |
| 2,753,808 | A * | 7/1956 | Kluge | F04D 29/30 416/183 |
| 3,865,506 | A * | 2/1975 | Gerlach | F04D 29/284 415/225 |
| 5,152,661 | A * | 10/1992 | Sheets | F01D 5/145 415/84 |
| 2005/0191174 | A1 * | 9/2005 | Zeng | F04D 17/025 415/206 |
| 2006/0204363 | A1 * | 9/2006 | Yen | F04D 29/281 416/228 |

(Continued)

*Primary Examiner* — Adam B Dravininkas
(74) *Attorney, Agent, or Firm* — Haynes and Boone, LLP (57) ABSTRACT

A multi-radial-zone varying blade density fan system includes a fan in a fan chassis including a plurality of fan blades. A first radial fan zone on the fan includes a first fan blade density provided by fan blades located in the first radial fan zone. A second radial fan zone on the fan is located adjacent the first radial fan zone and includes a second fan blade density that is greater than the first fan blade density and that is provided by fan blades located in the second radial fan zone. A third radial fan zone on the fan is located adjacent the second radial fan zone and includes a third fan blade density that is greater than the second fan blade density and that is provided by fan blades located in the third radial fan zone.

20 Claims, 10 Drawing Sheets

(56) References Cited

U.S. PATENT DOCUMENTS

| | | | |
|---|---|---|---|
| 2006/0257251 A1* | 11/2006 | Carlson | F04D 29/661 415/178 |
| 2014/0099207 A1* | 4/2014 | Yuan | F04D 25/064 416/198 R |
| 2015/0160690 A1* | 6/2015 | Kagy | H04L 12/6418 361/679.4 |
| 2017/0298950 A1* | 10/2017 | Ling | F04D 29/281 |

* cited by examiner

MULTI-RADIAL-ZONE VARYING BLADE DENSITY FAN SYSTEM

BACKGROUND

The present disclosure relates generally to information handling systems, and more particularly to a fan system for an information handling systems with multiple radial zones having varying blade densities.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often use fan systems in order to cool components of the information handling system. For example, server devices often include blower systems that provide a blower chassis that houses a fan, and that fan is rotated within the blower chassis to cause air to be drawn into an air inlet defined by the blower chassis, and then moved out of an air outlet defined by the blower chassis in order to cool a component located adjacent the blower system. However, the inventors of the present disclosure have recognized that conventional fans included in such blower systems suffer from several limitations. For example, many conventional fans include a central fan hub from which a plurality of fan blades extend radially, and the spacing of those fan blades reduces when measured in the radial direction moving closer to the central fan hub. Thus, as more fan blades are provided on the fan system, the spacing of the fan blades will reduce to a level that can affect the fan system airflow performance, particularly for fan systems with thicker fan blades that require air that enters the air inlet to move deeper into airflow channels defined between the fan blades. Conventional solutions to these issues are to remove radial portions of the fan blades that are immediately adjacent the central fan hub, which clears ab air intake path to the airflow channels defined between those fan blades. However, the removal of the radial portions of the fan blades in such solutions also reduces the fan system airflow performance, as those radial portions of the fan blades are no longer present to contribute to generating airflow.

Accordingly, it would be desirable to provide an improved fan system.

SUMMARY

According to one embodiment, an Information Handling System (IHS) includes a system chassis; a heat producing component that is located in the system chassis; a fan chassis that is located in the system chassis and adjacent the heat producing component; and a fan that is located in the fan chassis and that includes: a plurality of fan blades; a first radial fan zone that includes a first fan blade density provided by at least a portion of the plurality of fan blades that are located in the first radial fan zone; a second radial fan zone that is located adjacent the first radial fan zone and that includes a second fan blade density that is greater than the first fan blade density and that is provided by at least a portion of the plurality of fan blades that are located in the second radial fan zone; and a third radial fan zone that is located adjacent the second radial fan zone and that includes a third fan blade density that is greater than the second fan blade density and that is provided by at least a portion of the plurality of fan blades that are located in the third radial fan zone.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
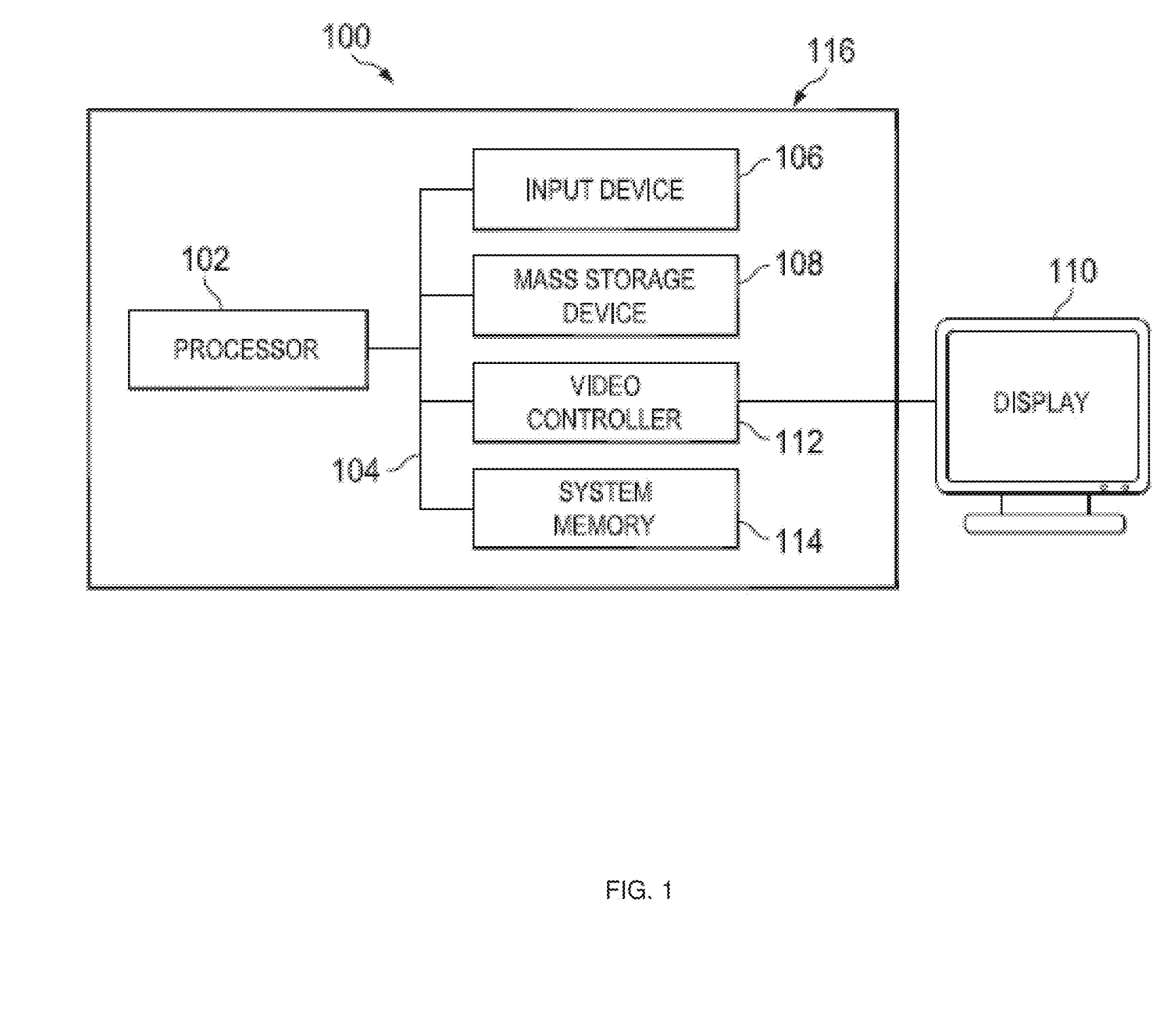
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
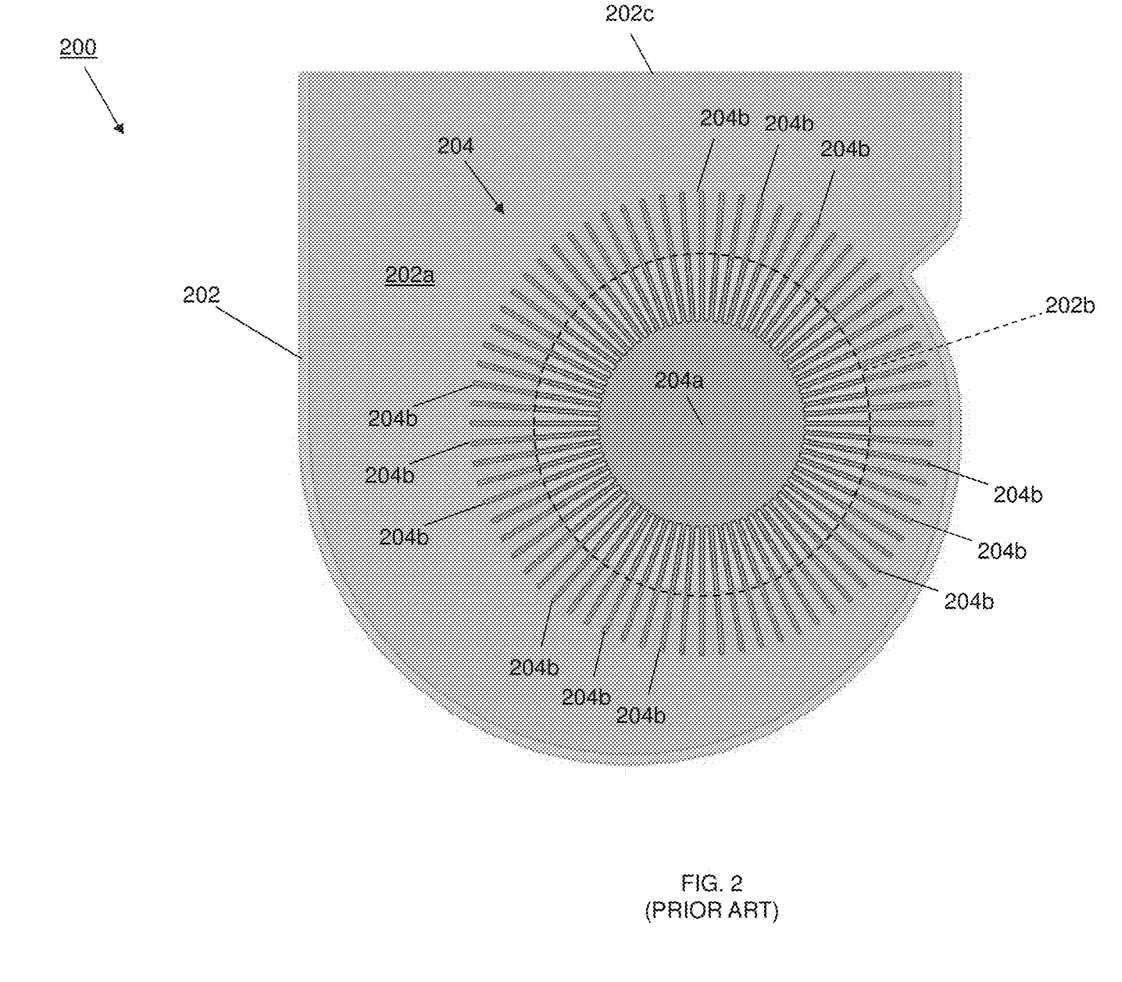
FIG. 2 is a top view illustrating an embodiment of a conventional fan included in a conventional blower system.

Referring next to FIG. 2, a conventional blower system 200 is illustrated for purposes of discussion below. The conventional blower system 200 includes a blower chassis 202 that defines a blower housing 202a. The blower chassis 202 also defines an air inlet 202b (illustrated with a dashed line in FIG. 2) that extends through a wall on the blower chassis 202 to the blower housing 202a, as well as an air outlet 202c that allows air that enters the blower housing 202a via the blower inlet 202b to exit the blower housing 202a. A fan 204 is located in the blower housing 202a adjacent the air inlet 202b (e.g., coaxial with the air inlet in the illustrated embodiment). The fan 204 includes a central fan hub 204a, with a plurality of fan blades 204b extending radially from the central fan hub 204a. In operation, the fan 204 is rotated in order to draw air in through the air inlet 202b and into the airflow channels defined between the fan blades 204b, and then push that air through the blower housing 202a and out of the air outlet 202c in order to cool a heat producing component (not illustrated, but which may be provided by the processor 102 discussed above with reference to FIG. 1, the memory 114 discussed above with reference to FIG. 1, and/or any other heat producing components that would be apparent to one of skill in the art in possession of the present disclosure). As can be seen in FIG. 2, the spacing of the fan blades 204b reduces when measured in the radial direction moving closer to the central fan hub 204. As such, as more fan blades 204b are provided on the fan 204, the spacing of the fan blades 204b will reduce to a level that can affect the fan airflow performance, particularly for fans with thicker fan blades (e.g., as measured in a direction directed into the page) that require air that enters the air inlet 202b to move deeper into airflow channels defined between the fan blades 204b.

Figure 3:
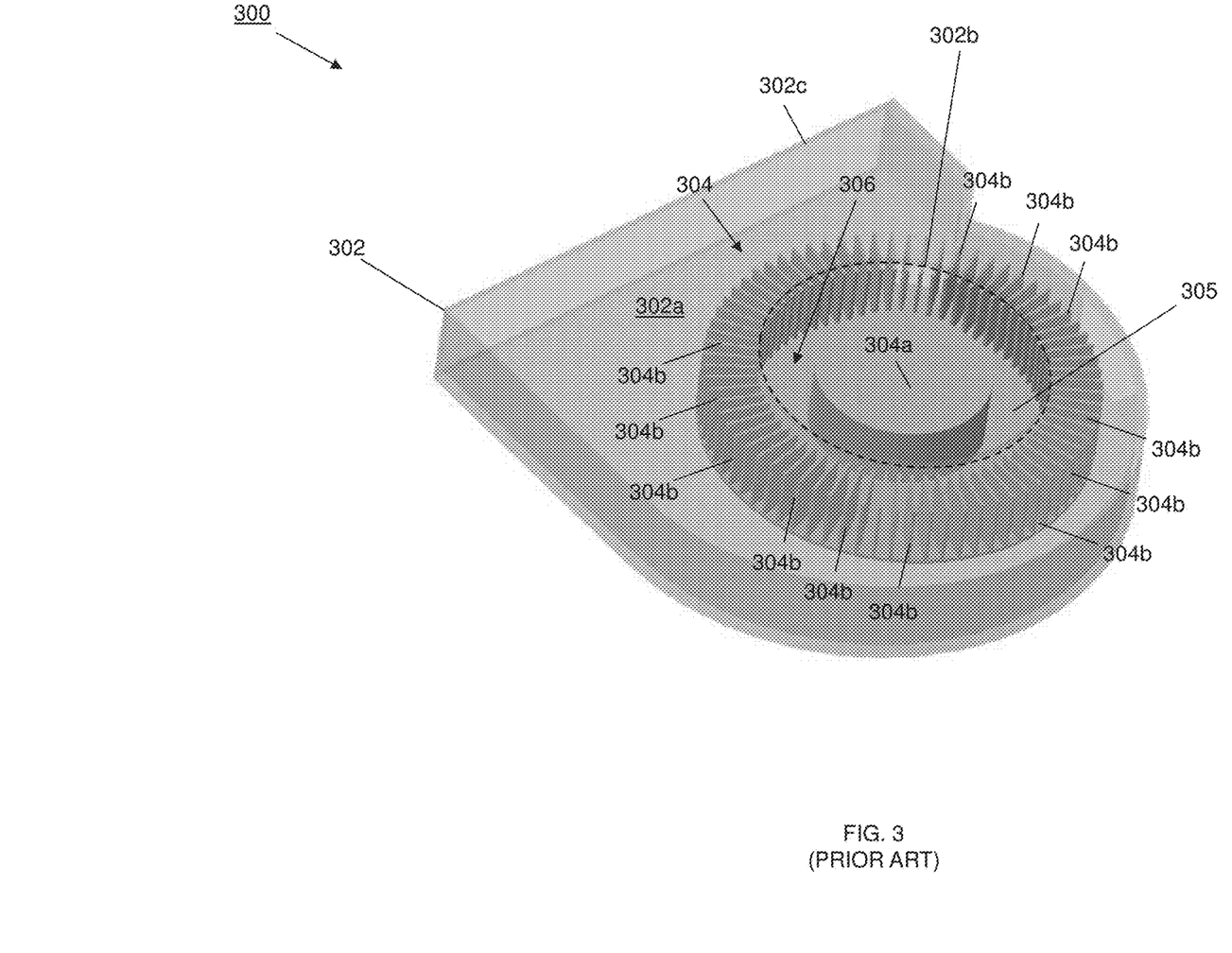
FIG. 3 is a perspective view illustrating an embodiment of a conventional fan included in a conventional blower system

Referring next to FIG. 3, another conventional blower system 300 is illustrated for purposes of discussion below. The conventional blower system 300 includes a blower chassis 302 that defines a blower housing 302a. The blower chassis 302 also defines an air inlet 302b (illustrated with a dashed line in FIG. 2) that extends through a wall on the blower chassis 302 to the blower housing 302a, as well as an air outlet 302c that allows air that enters the blower housing 302a via the blower inlet 302b to exit the blower housing 302a. A fan 304 is located in the blower housing 302a adjacent the air inlet 302b. The fan 304 includes a central fan hub 304a extending from a fan base 305, with a plurality of fan blades 304b spaced apart from the central fan hub 304a, extending from the fan base 305, and extending radially away from the central fan hub 304a in order to define an air inlet channel 306 between the central fan hub 304a and the fan blades 304b. In operation, the fan 304 is rotated in order to draw air in through the air inlet 302b to the air inlet channel 306, and then push that air through the blower housing 302a and out of the air outlet 302c in order to cool a heat producing component (not illustrated, but which may be provided by the processor 102 discussed above with reference to FIG. 1, the memory 114 discussed above with reference to FIG. 1, and/or any other heat producing components that would be apparent to one of skill in the art in possession of the present disclosure). As can be seen in FIG. 2, the air inlet channel 306 prevents the spacing of the fan blades 304b from reducing to a level adjacent the air inlet 302b that can affect the fan airflow performance, but still operates to reduce the fan airflow performance as the radial portions of the fan blades 304b that are removed to provide the air inlet channel 306 are no longer present to contribute to generating airflow.

Figure 4A:
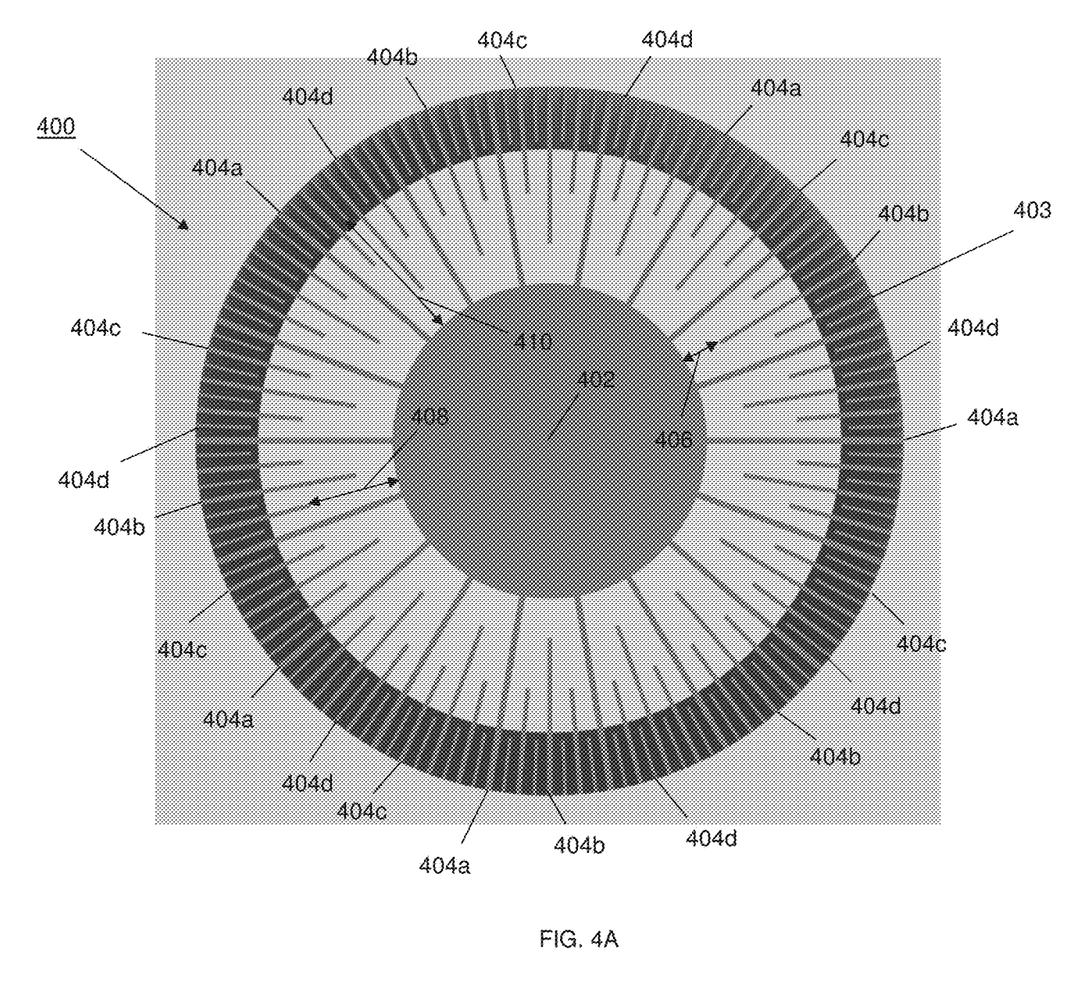
FIG. 4A is a top view illustrating an embodiment of a fan provided according to the teachings of the present disclosure.
Figure 4B:
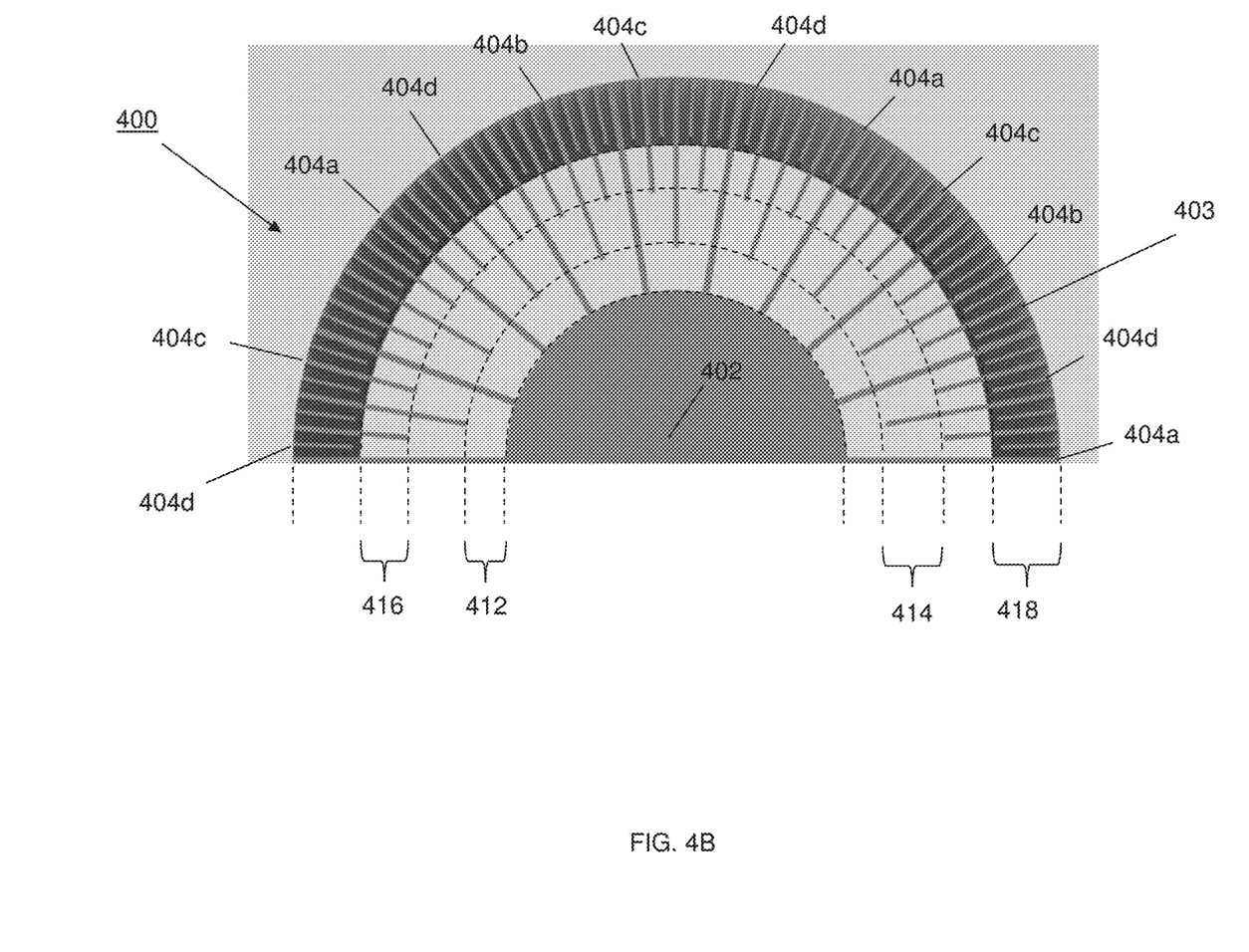
FIG. 4B is a partial top view illustrating an embodiment of the fan of FIG. 4A including a plurality of radial fan zones with different fan blade densities.

Referring now to FIGS. 4A and 4B, an embodiment of a fan 400 that is provided according to the teachings of the present disclosure is illustrated. As discussed above, the fan 400 may replace the fan 204 in the blower chassis 202 of the conventional blower system 200 discussed above with reference to FIG. 2, the fan 304 in the blower chassis 302 of the conventional blower system 300 discussed above with reference to FIG. 3, and/or may be provided in any other fan system that would be apparent to one of skill in the art in possession of the present disclosure. In the illustrated embodiment, the fan 400 includes a central fan hub 402 and a fan base 403. In some examples, the fan base 403 may extend from the central fan hub 402 in a manner similar to that described above with the central fan hub 304a and the fan base 305 in the conventional blower system 300 of FIG. 3. However, in other examples, the fan base 403 may be supported by the fan blades on the fan 400 as described below. The fan 400 includes a plurality of fan blades 404 that each extend in a radial direction away from the central fan hub 304a. In the illustrated embodiment, a first subset 404a of the plurality of fan blades 404 extend between the central fan hub 402 and the fan base 403 and up to a perimeter of the fan 400, and are oriented in a radial direction away from the central fan hub 402. In some examples such as that of the illustrated embodiment, the first subset 404a of the plurality of fan blades may operate to support the fan base 403 with respect to the central fan hub 402. However, in other examples, the fan base 403 may extend from the central fan hub 402 (with the first subset 404a of the plurality of fan blades 404 extending from each of the central fan hub 402 and the fan base 403 along their lengths) while remaining within the scope of the present disclosure as well.

With reference to FIG. 4A, in the illustrated embodiment, a second subset 404b of the plurality of fan blades 404 extend from the fan base 403 and are oriented in a radial direction away from the central fan hub 402, with each of the second subset 404b of the plurality of fan blades 404 spaced apart from the central fan hub 304a by a distance 406. In a specific example such as that illustrated in FIGS. 4A and 4B, the length of the second subset 404b of the plurality of fan blades 404 may be approximately 75% of the length of the first subset 404a of the plurality of fan blades 404 (e.g., as measured from the end of those fan blades immediately adjacent the perimeter of the fan 400 to the opposite end of those fan blades). In the illustrated embodiment, a third subset 404c of the plurality of fan blades 404 extend from the fan base 403 and are oriented in a radial direction away from the central fan hub 402, with each of the third subset 404c of the plurality of fan blades 404 spaced apart from the central fan hub 304a by a distance 408. In a specific example such as that illustrated in FIGS. 4A and 4B, the length of the third subset 404c of the plurality of fan blades 404 may be approximately 50% of the length of the first subset 404a of the plurality of fan blades 404 (e.g., as measured from the end of those fan blades immediately adjacent the perimeter of the fan 400 to the opposite end of those fan blades).

In the illustrated embodiment, a fourth subset 404d of the plurality of fan blades 404 extend from the fan base 403 and are oriented in a radial direction away from the central fan hub 402, with each of the fourth subset 404d of the plurality of fan blades 404 spaced apart from the central fan hub 304a by a distance 410. In a specific example such as that illustrated in FIGS. 4A and 4B, the length of the fourth subset 404d of the plurality of fan blades 404 may be approximately 25% of the length of the first subset 404a of the plurality of fan blades 404 (e.g., as measured from the end of those fan blades immediately adjacent the perimeter of the fan 400 to the opposite end of those fan blades). However, while a specific number of different subsets of fan blades and specific length ratios of the subsets of fan blades have been illustrated and described, one of skill in the art in possession of the present disclosure will recognize that different number of subsets of fan blades having different length and/or subsets of fan blades having different length ratios, may be utilized according to the teachings of the present disclosure while remaining within its scope as well.

With reference to FIG. 4B, in the illustrated embodiment, the fan 400 defines a first radial fan zone 412 that is located immediately adjacent the central fan hub 402, and that extends in a radial direction from the central fan hub 402 and up to approximately the end of the second subset 404b of the plurality of fan blades 404. As can be seen in the specific example of the fan 400 illustrated in FIG. 4B, the first radial fan zone 412 includes a first fan blade density that is provided by the portion of the first subset 404a of the plurality of fan blades 404 that are located in the first radial fan zone 412.

Furthermore, the fan 400 also defines a second radial fan zone 414 that is located immediately adjacent the first radial fan zone 412, and that extends in a radial direction away the central fan hub 402 to approximately the end of the third subset 404c of the plurality of fan blades 404 such that the second radial fan zone 414 is spaced apart from the central fan hub 402 by approximately the distance 406 illustrated in FIG. 4A. As can be seen in the specific example of the fan 400 illustrated in FIG. 4B, the second radial fan zone 414 includes a second fan blade density that is greater than the first fan blade density and that is provided by the portion of the first subset 404a of the plurality of fan blades 404 that are located in the second radial fan zone 414, and the portion of the second subset 404b of the plurality of fan blades 404 that are located in the second radial fan zone 414.

Further still, the fan 400 also defines a third radial fan zone 416 that is located immediately adjacent the second radial fan zone 414, and that extends in a radial direction away from the central fan hub 402 to approximately the end of the fourth subset 404d of the plurality of fan blades 404 such that the third radial fan zone 416 is spaced apart from the central fan hub 402 by approximately the distance 408 illustrated in FIG. 4A. As can be seen in the specific example of the fan 400 illustrated in FIG. 4B, the third radial fan zone 416 includes a third fan blade density that is greater than the second fan blade density and that is provided by the portion of the first subset 404a of the plurality of fan blades 404 that are located in the third radial fan zone 416, the portion of the second subset 404b of the plurality of fan blades 404 that are located in the third radial fan zone 416, and the portion of the third subset 404c of the plurality of fan blades 404 that are located in the third radial fan zone 416.

Further still, the fan 400 also defines a fourth radial fan zone 418 that is located immediately adjacent the third radial fan zone 416, and that extends in a radial direction away from the central fan hub 402 to the perimeter of the fan 400, such that the fourth radial fan zone 418 is spaced apart from the central fan hub 402 by approximately the distance 410 illustrated in FIG. 4A. As can be seen in the specific example of the fan 400 illustrated in FIG. 4B, the fourth radial fan zone 418 includes a fourth fan blade density that is provided by the portion of the first subset 404a of the plurality of fan blades 404 that are located in the fourth radial fan zone 418, the portion of the second subset 404b of the plurality of fan blades 404 that are located in the fourth radial fan zone 418, the portion of the third subset 404c of the plurality of fan blades 404 that are located in the fourth radial fan zone 418, and the entirety of the fourth subset 404d of the plurality of fan blades that are located in the fourth radial fan zone 418.

As can be seen in FIGS. 4A and 4B, adjacent fan blades 404 define airflow channels between them. For example, in the first radial fan zone 412, first airflow channels having approximately a first airflow channel size are defined between any two adjacent fan blades (e.g., the portion of the first subset 404a of the plurality of fan blades 404 that are located in the first radial fan zone 412.) Similarly, in the second radial fan zone 414, second airflow channels having approximately a second airflow channel size that is less than the first airflow channel size are defined between any two adjacent fan blades (e.g., the portion of the first subset 404a of the plurality of fan blades 404 that are located in the second radial fan zone 414, and the portion of the second subset 404b of the plurality of fan blades 404 that are located in the second radial fan zone 414.)

Similarly, in the third radial fan zone 416, third airflow channels having approximately a third airflow channel size that is less than the second airflow channel size are defined between any two adjacent fan blades (e.g., the portion of the first subset 404a of the plurality of fan blades 404 that are located in the third radial fan zone 416, the portion of the second subset 404b of the plurality of fan blades 404 that are located in the third radial fan zone 416, and the portion of the third subset 404c of the plurality of fan blades 404 that are located in the third radial fan zone 416.) Similarly, in the fourth radial fan zone 418, fourth airflow channels having approximately a fourth airflow channel size that is less than the third airflow channel size are defined between any two adjacent fan blades (e.g., the portion of the first subset 404a of the plurality of fan blades 404 that are located in the fourth radial fan zone 418, the portion of the second subset 404*b* of the plurality of fan blades 404 that are located in the fourth radial fan zone 418, the portion of the third subset 404*c* of the plurality of fan blades 404 that are located in the fourth radial fan zone 418, and the entirety of the fourth subset 404*d* of the plurality of fan blades that are located in the fourth radial fan zone 418.) While a specific fan 400 has been described, one of skill in the art in possession of the present disclosure will recognize that a wide variety of modification to the fan 400 illustrated in FIGS. 4A and 4B (e.g., fewer or more radial fan zones, different fan blade densities, different sizes of different airflow channels, etc.) will fall within the scope of the present disclosure as well.

Figure 5A:
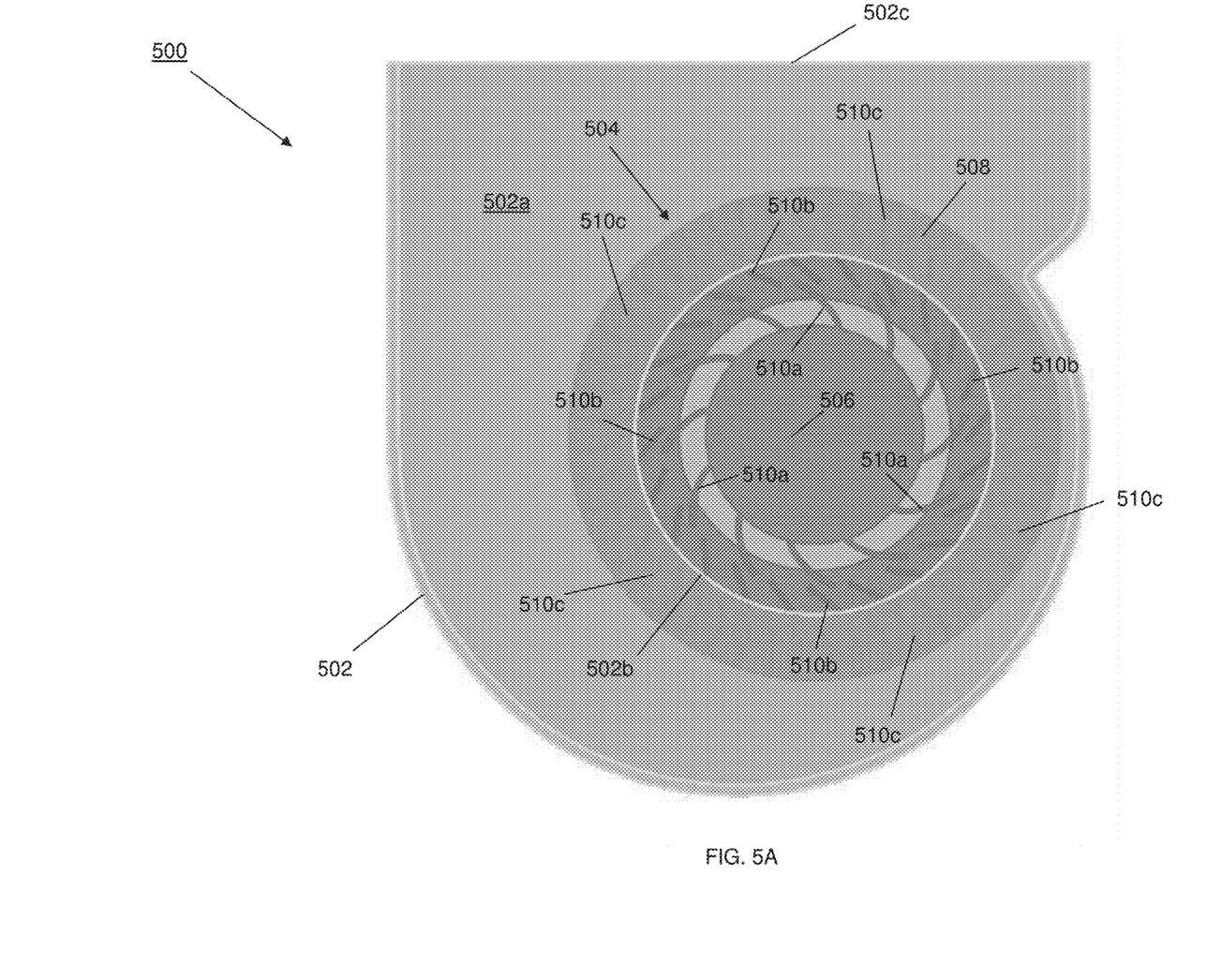
FIG. 5A is a top view illustrating an embodiment of a fan provided according to the teachings of the present disclosure.
Figure 5B:
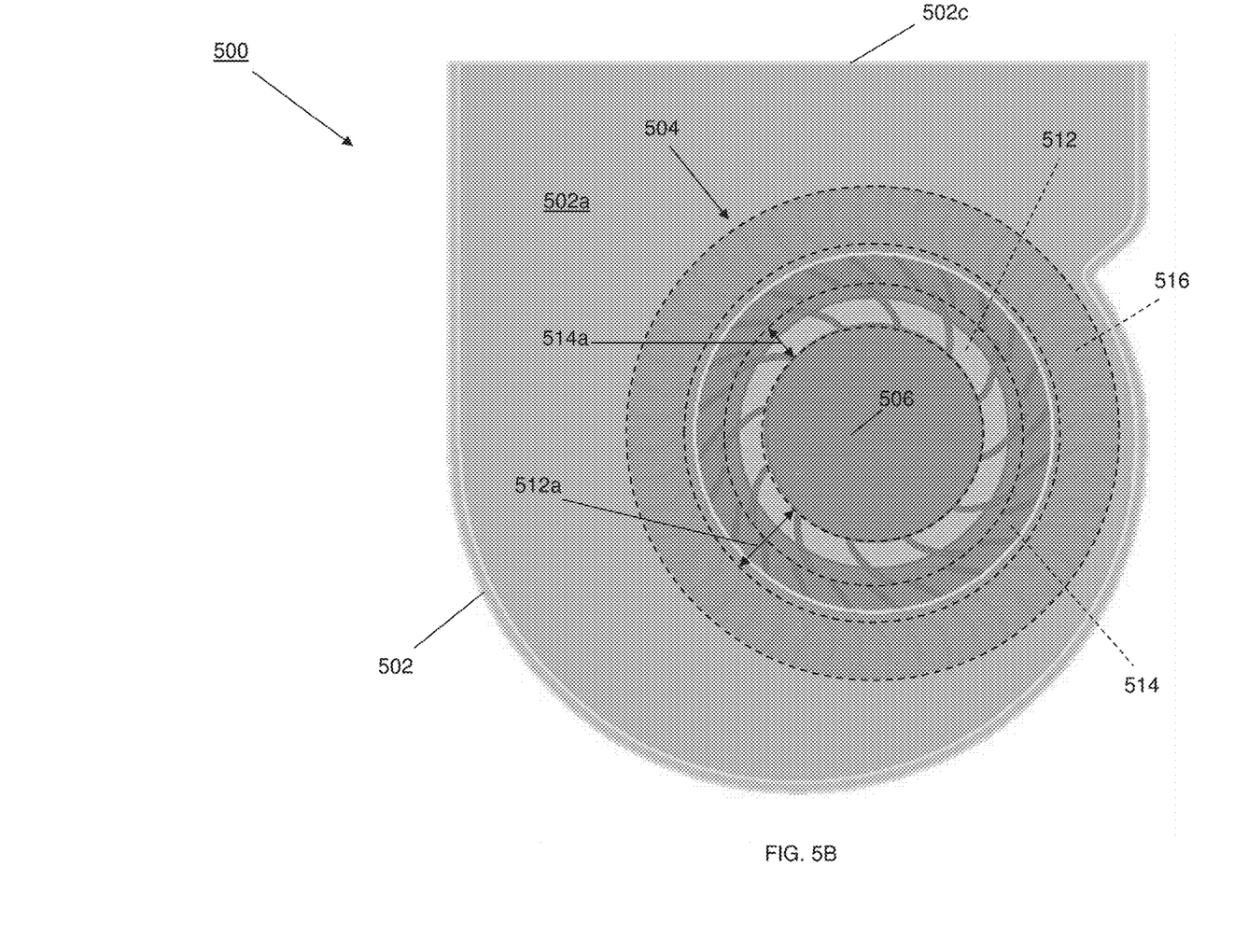
FIG. 5B is a partial top view illustrating an embodiment of the fan of FIG. 5A including a plurality of radial fan zones with different fan blade densities

Referring now to FIGS. 5A and 5B, an embodiment of a blower system 500 that is provided according to the teachings of the present disclosure is illustrated. The blower system 500 includes a blower chassis 502 that defines a blower housing 502*a*. The blower chassis 502 also defines an air inlet 502*b* that extends through a wall on the blower chassis 502 to the blower housing 502*a*, as well as an air outlet 502*c* that allows air that enters the blower housing 502*a* via the blower inlet 502*b* to exit the blower housing 502*a*. A fan 504 is located in the blower housing 502*a* adjacent the air inlet 502*b*. In the illustrated embodiment, the fan 504 includes a central fan hub 506 and a fan base 508 that extends from the central fan hub 506 in a manner similar to that described above with the central fan hub 304*a* and the fan base 305 in the conventional blower system 300 of FIG. 3. The fan 504 includes a plurality of fan blades 510. For example, a first subset 510*a* of the plurality of fan blades 510 extend from the central fan hub 506 and, in the illustrated embodiment, include an arcuate shape that provides a "forward bend" in each of the first subset 510*a* of the plurality of fan blades 510 that may be configured to provide desirable airflow characteristics (e.g., an desirable Cubic Feet per Minute (CFM) airflow). Furthermore, a second subset 510*b* of the plurality of fan blades 510 extend from the fan base 508 are spaced apart from each of the central fan hub 506 and a perimeter of the fan 504 and, in the illustrated embodiment, include a substantially straight shape that may be configured to balance CFM airflow and airflow pressure. Further still, a third subset 510*c* of the plurality of fan blades 510 extend from the fan base 508 and the perimeter of the fan 504, are spaced apart from the central fan hub 506 and, in the illustrated embodiment, include an arcuate shape that provides a "backwards bend" in each of the third subset 510*a* of the plurality of fan blades 510 that may be configured to provide desirable airflow characteristics (e.g., a desirable airflow pressure. However, while a specific number of different subsets of fan blades and specific shapes of the subsets of fan blades have been illustrated and described, one of skill in the art in possession of the present disclosure will recognize that different number of subsets of fan blades having different shapes, may be utilized according to the teachings of the present disclosure while remaining within its scope as well.

With reference to FIG. 5B, in the illustrated embodiment, the fan 504 defines a first radial fan zone 512 that is located immediately adjacent the central fan hub, and that extends in a radial direction away from the central fan hub 506 to approximately the end of the second subset 510*b* of the plurality of fan blades 510. As can be seen in the specific example of the fan 504 illustrated in FIG. 5B, the first radial fan zone 512 includes a first fan blade density that is provided by the first subset 510*a* of the plurality of fan blades 510 that are located in the first radial fan zone 512. Furthermore, the fan 504 also defines a second radial fan zone 514 that is located immediately adjacent the first radial fan zone 512, and that extends in a radial direction away from the central fan hub 506 to approximately the end of the third subset 510*c* of the plurality of fan blades 510 such that the second radial fan zone 514 is spaced apart from the central fan hub 506 by approximately a distance 514*a*. As can be seen in the specific example of the fan 504 illustrated in FIG. 5B, the second radial fan zone 514 includes a second fan blade density that is greater than the first fan blade density and that is provided by the second subset 510*b* of the plurality of fan blades 510 that are located in the second radial fan zone 514. Further still, the fan 504 defines a third radial fan zone 516 that is located immediately adjacent the second radial fan zone 514, and that extends in a radial direction to the perimeter of the fan 504 such that the third radial fan zone 516 is spaced apart from the central fan hub 506 by approximately a distance 512*a*. As can be seen in the specific example of the fan 504 illustrated in FIG. 5B, the third radial fan zone 516 includes a third fan blade density that is greater than the second fan blade density and that is provided by the third subset 510*c* of the plurality of fan blades 510 that are located in the third radial fan zone 516.

As can be seen in FIGS. 4A and 4B, adjacent fan blades 510 define airflow channels between them. For example, in the first radial fan zone 512, first airflow channels having approximately a first airflow channel size are defined between any two of the first subset 510*a* of the plurality of fan blades 510 that are located in the first radial fan zone 512. Similarly, in the second radial fan zone 514, second airflow channels having approximately a second airflow channel size that is less than the first airflow channel size are defined between any two of the second subset 510*b* of the plurality of fan blades 510 that are located in the second radial fan zone 514. Similarly, in the third radial fan zone 516, third airflow channels having approximately a third airflow channel size that is less than the second airflow channel size are defined between any two of the third subset 510*a* of the plurality of fan blades 510 that are located in the third radial fan zone 516. While a specific fan 504 has been described in a blower system 500, one of skill in the art in possession of the present disclosure will recognize that a wide variety of modification to the fan 504 and/or the blower system 500 illustrated in FIGS. 5A and 5B (e.g., fewer or more radial fan zones, different fan blade densities, different sizes of different airflow channels, fan systems other than blower systems, etc.) will fall within the scope of the present disclosure as well.

Figure 6:
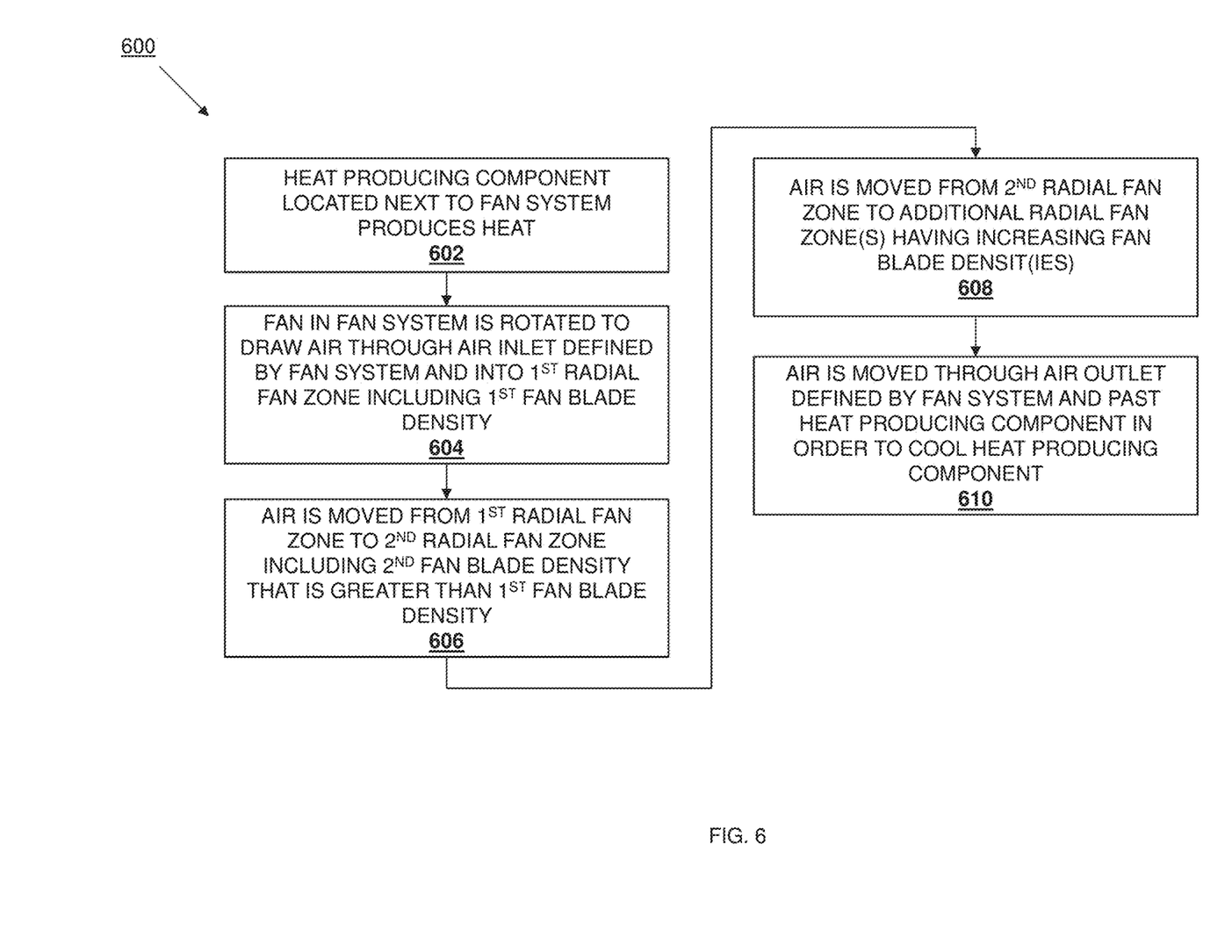
FIG. 6 is a flow chart illustrating an embodiment of a method for providing an airflow.

Referring now to FIG. 6, an embodiment of a method 600 method for providing an airflow is illustrated. As discussed below, the systems and methods of the present disclosure provide a fan for fan systems that includes different radial fan zones having different fan blade densities. For example, the fan blade densities of the radial fan zones included on the fan may increase from a first radial fan zone immediately adjacent an air inlet on the fan system to a last radial fan zone that is adjacent a perimeter of the fan and an air outlet on the fan system. As such, the size of the airflow channels between the fan blades on the fan is greater adjacent the air inlet of the fan system relative to that adjacent the perimeter of the fan in order to allow increased amounts of air into the airflow channels on the fan, while the number of fan blades on the fan increases in a radial direction on the fan from the air inlet to the perimeter of the fan in order to provide for fan blades to move more air via the fan. As such, the reduced airflow performance characteristics of conventional fan systems such as the blower systems 200 and 300 discussed above are improved upon by allowing more air into the fan relative to the blower system 200, while providing more air movement than the blower system 300.

The method 600 begins at block 602 where a heat producing component located next to a fan system is operated to produce heat. In an embodiment, at block 602, a heat producing component that is located adjacent a fan system is operated to produce heat. In the examples below, the fan 400 is provided in a fan system such as, for example, in place of the fans 204 and 304 in the blower systems 200 and 300, respectively, and that fan system is located adjacent a heat producing component in a computing system such as, for example, a processor, a memory, a power supply unit, and/or other heat producing components that would be apparent to one of skill in the art in possession of the present disclosure. As such, at block 602, the heat producing component operates and produces heat. As would be understood by one of skill in the art in possession of the present disclosure, a temperature sensor may be provided that is configured to report the temperature of the heat producing component to the thermal control system, with the thermal control system configured to activate the fan in the fan system based on that reported temperature.

Figure 7:
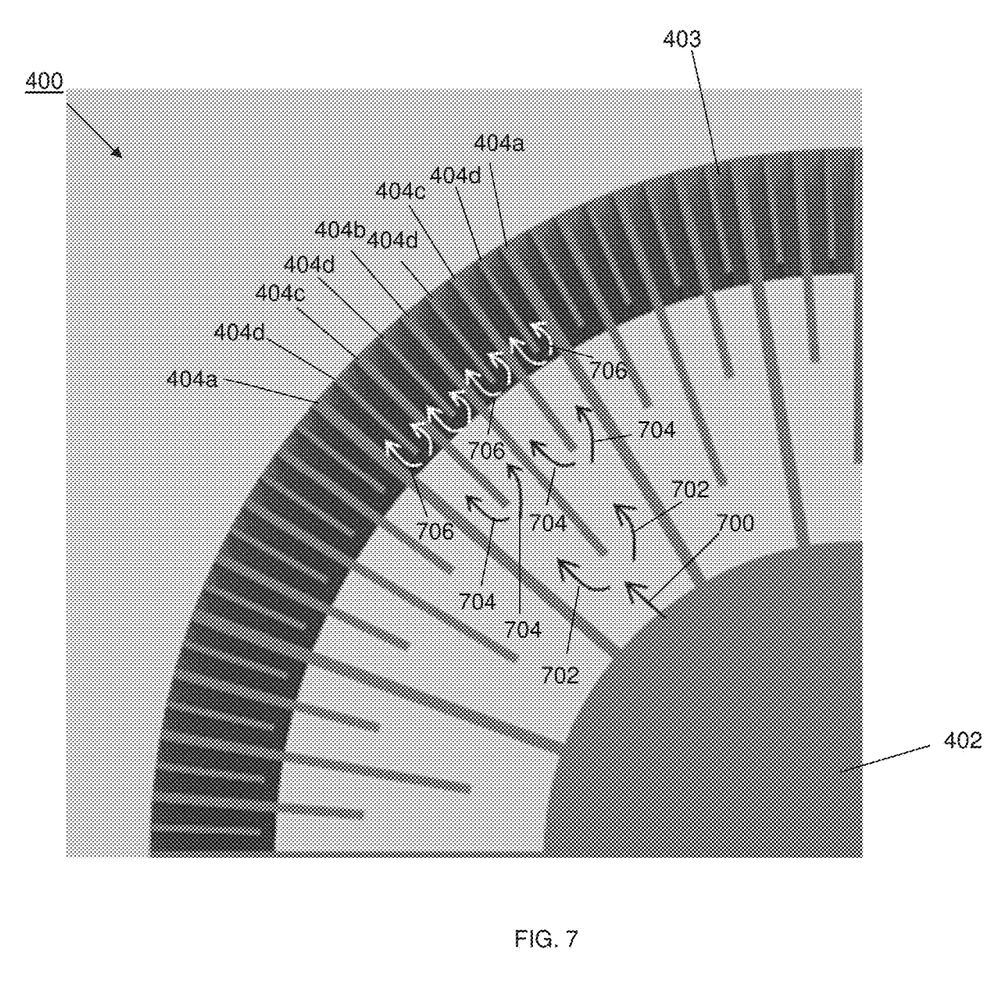
FIG. 7 is a top view illustrating an embodiment of airflow through the fan of FIGS. 5A and 5B.

The method 600 then proceeds to block 604 where a fan in the fan system is rotated to draw air through an air inlet defined by the fan system and into a first radial fan zone that is defined by the fan and that includes a first fan blade density. In an embodiment, at block 604, the fan 400 in the fan system may be activated by, for example, the thermal control system discussed above, which may cause the fan 400 to rotate. As will be appreciated by one of skill in the art in possession of the present disclosure, in response to the rotation of the fan 400, air will be drawn into the fan system via an air inlet (e.g., air will be drawn through the air inlet 202b and into the blower housing 202a defined by the blower chassis 202, air will be drawn through the air inlet 302b and into the blower housing 302a defined by the blower chassis 302, etc.). Furthermore, air drawn in through the air inlet on the fan system will enter the first radial fan zone 412 included on the fan 400 such that the air is located in the airflow channels defined between the portions of the first subset 404a of the fan blades 404. With reference to FIG. 7, air 700 is illustrated that has entered the first radial fan zone 412 from the air inlet in the fan system, and that is moving through the airflow channels defined between the portions of the first subset 404a of the fan blades 404.

The method 600 then proceeds to block 606 where the air is moved from the first radial fan zone to a second radial fan zone that is defined by the fan and that includes a second fan blade density that is greater than the first fan blade density. In an embodiment, at block 606, the fan 400 in the fan system will continue to rotate due to, for example, control signals provided by the thermal control system discussed above. As will be appreciated by one of skill in the art in possession of the present disclosure, in response to the rotation of the fan 400, air located in the first radial fan zone 412 will be moved through the airflow channels defined between the portions of the first subset 404a of the fan blades 404, and will enter the second radial fan zone 414 included on the fan 400 such that the air is located in the airflow channels defined between the portions of the first subset 404a of the fan blades 404 and between the portions of the second subset 404b of the plurality of fan blades 404. With reference to FIG. 7, air 702 is illustrated that has entered the second radial fan zone 414 from the first radial fan zone 412, and that is moving through the airflow channels defined between the portions of the first subset 404a of the fan blades 404 and between the portions of the second subset 404b of the plurality of fan blades 404.

The method 600 then proceeds to block 608 where the air is moved from the second radial fan zone to additional radial fan zone(s) that are defined by the fan and that include increasing fan blade densit(ies). In an embodiment, at block 608, the fan 400 in the fan system will continue to rotate due to, for example, control signals provided by the thermal control system discussed above. As will be appreciated by one of skill in the art in possession of the present disclosure, in response to the rotation of the fan 400, air located in the second radial fan zone 414 will be moved through the airflow channels defined between the portions of the first subset 404a of the fan blades 404 and between the portions of the second subset 404b of the plurality of fan blades 404, and will enter the third radial fan zone 416 included on the fan 400 such that the air is located in the airflow channels defined between the portions of the first subset 404a of the fan blades 404, between the portions of the second subset 404b of the plurality of fan blades 404, and between the portions of the third subset 404c of the plurality of fan blades 404. With reference to FIG. 7, air 704 is illustrated that has entered the third radial fan zone 416 from the second radial fan zone 414, and that is moving through the airflow channels defined between the portions of the first subset 404a of the fan blades 404, between the portions of the second subset 404b of the plurality of fan blades 404, and between the portions of the third subset 404c of the plurality of fan blades 404.

Similarly, at block 608, the fan 400 in the fan system will continue to rotate due to, for example, control signals provided by the thermal control system discussed above. As will be appreciated by one of skill in the art in possession of the present disclosure, in response to the rotation of the fan 400, air located in the third radial fan zone 416 will be moved through the airflow channels defined between the portions of the first subset 404a of the fan blades 404, between the portions of the second subset 404b of the plurality of fan blades 404, and between the portions of the third subset 404c of the plurality of fan blades 404, and will enter the fourth radial fan zone 418 included on the fan 400 such that the air is located in the airflow channels defined between the portions of the first subset 404a of the fan blades 404, between the portions of the second subset 404b of the plurality of fan blades 404, between the portions of the third subset 404c of the plurality of fan blades 404, and between the portions of the fourth subset 404d of the plurality of fan blades 404. With reference to FIG. 7, air 706 is illustrated that has entered the fourth radial fan zone 418 from the third radial fan zone 416, and that is moving through the airflow channels defined between the portions of the first subset 404a of the fan blades 404, between the portions of the second subset 404b of the plurality of fan blades 404, between the portions of the third subset 404c of the plurality of fan blades 404, and between the portions of the fourth subset 404d of the plurality of fan blades 404.

The method 600 then proceeds to block 610 where the air is moved through an air outlet defined by the fan system and past the heat producing component in order to cool the heat producing component. In an embodiment, at block 610, the fan 400 in the fan system will continue to rotate due to, for example, control signals provided by the thermal control system discussed above. As will be appreciated by one of skill in the art in possession of the present disclosure, in response to the rotation of the fan 400, air located in the fourth radial fan zone 418 will be moved through the airflow channels defined between the portions of the first subset 404a of the fan blades 404, between the portions of the second subset 404b of the plurality of fan blades 404, between the portions of the third subset 404c of the plurality of fan blades 404, and between the portions of the fourth subset 404d of the plurality of fan blades 404, and will then exit the fan 400, enter the housing of the fan system (e.g., the blower housing 202a defined by the blower chassis 202, the blower housing 302a defined by the blower chassis 302, etc.), and exit the air outlet of the fan system (e.g., the air outlet 202c defined by the blower chassis 202, the air outlet 302c defined by the blower chassis 302, etc.) Furthermore, air exiting the air outlet of the fan system may be directed past the heat producing component in order to dissipate heat generated by that heat producing component, thus cooling the heat producing component.

Figure 8:
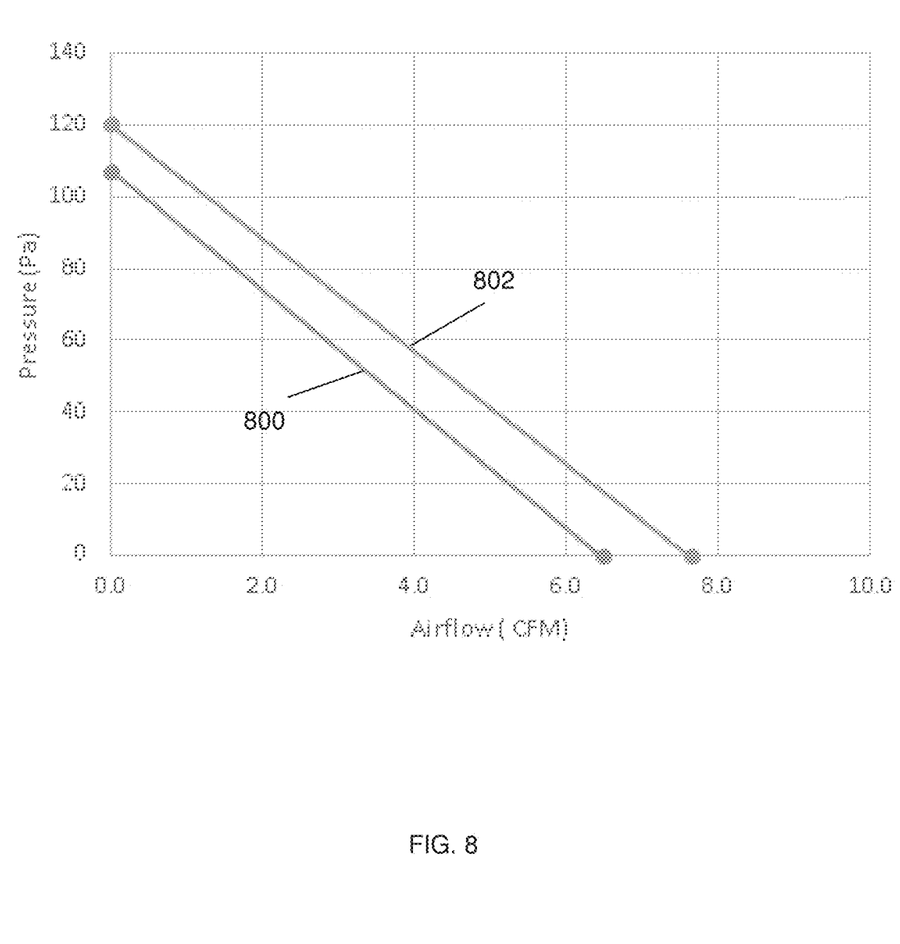
FIG. 8 is a graph view illustrating an embodiment of airflow performance of the fan of FIGS. 5A and 5B vs. the fan of FIG. 2.

With reference to FIG. 8, an experimental embodiment of airflow vs. pressure was determined for a simulation of the operation of the conventional blower system 200 discussed above with reference to FIG. 2, and a simulation of the operation of the fan 400 in place of the fan 204 in the blower chassis 202. As can be seen, the conventional fan performance 800 of the fan 204 in the blower system 200 produced lower airflow performance than the present disclosure fan performance 802 of the fan 400 in the blower chassis 202, with the present disclosure fan performance 802 exhibiting 12% higher pressure and 18% higher CFM airflow relative to the conventional fan performance 800.

Thus, systems and methods have been described that provide a fan for fan systems that includes different radial fan zones having different fan blade densities. For example, the fan blade densities of the radial fan zones included on the fan may increase radially moving away from the center of the fan, providing airflow channel sizes between the fan blades on the fan that are greater adjacent the air inlet of the fan system in order to allow increased amounts of air into the airflow channels on the fan, while providing an increased number of fan blades on the fan as the air moves towards the perimeter of the fan in order to move more air via the fan. While not described in detail, one of skill in the art in possession of the present disclosure will recognize that the fan system illustrated in FIGS. 4A and 4B may operate in substantially the same manner as discussed above during the method 400, while providing different airflow characteristics due to the differences between the fan blades 510 and the fan blades 404.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-radial-zone varying blade density fan system, comprising:
   a fan chassis; and
   a fan that is located in the fan chassis and that includes:
   a plurality of fan blades;
   a first radial fan zone that includes a first fan blade density provided by a first portion of the plurality of fan blades, wherein the first portion of the plurality of fan blades extend from at least one of a fan base included in the fan or a central fan hub included in the fan;
   a second radial fan zone that is located adjacent the first radial fan zone and that includes a second fan blade density that is greater than the first fan blade density and that is provided by at least a second portion of the plurality of fan blades, wherein the second portion of the plurality of fan blades extend from the fan base toward the central fan hub; and
   a third radial fan zone that is located adjacent the second radial fan zone and that includes a third fan blade density that is greater than the second fan blade density and that is provided by at least a third portion of the plurality of fan blades, wherein the third portion of the plurality of fan blades extend from the fan base toward the central fan hub.

2. The system of claim 1, wherein the fan includes:
   a fourth radial fan zone that is located adjacent the third radial fan zone and that includes a fourth fan blade density that is greater than the third fan blade density and that is provided by at least a fourth portion of the plurality of fan blades, wherein the fourth portion of the plurality of fan blades extend from the fan base toward the central fan hub.

3. The system of claim 1, wherein the plurality of fan blades that include the first portion that is located in the first radial fan zone are also located in the second radial fan zone and the third radial fan zone.

4. The system of claim 3, wherein the plurality of fan blades that include the second portion that is located in the second radial fan zone are also located in the third radial fan zone.

5. The system of claim 1, wherein the fan chassis defines an air inlet that is located axially adjacent the first radial fan zone, and wherein the fan chassis defines an air outlet that is located radially adjacent the third radial fan zone.

6. The system of claim 1, wherein the plurality of fan blades that include at least a portion that is located in the first radial fan zone extend from the central fan hub.

7. An Information Handling System (IHS), comprising:
   a system chassis;
   a heat producing component that is located in the system chassis;
   a fan chassis that is located in the system chassis and adjacent the heat producing component; and
   a fan that is located in the fan chassis and that includes:
   a plurality of fan blades;
   a first radial fan zone that includes a first fan blade density provided by a first portion of the plurality of fan blades, wherein the first portion of the plurality of fan blades extend from at least one of a fan base or a central fan hub;
   a second radial fan zone that is located adjacent the first radial fan zone and that includes a second fan blade density that is greater than the first fan blade density and that is provided by at least a second portion of the plurality of fan blades that are located in the second radial fan zone, wherein the second portion of the plurality of fan blades extend from the fan base toward the central fan hub; and
   a third radial fan zone that is located adjacent the second radial fan zone and that includes a third fan blade density that is greater than the second fan blade density and that is provided by at least a third portion of the plurality of fan blades, wherein the third portion of the plurality of fan blades extend from the fan base toward the central fan hub.

8. The IHS of claim 7, wherein the fan includes:
   a fourth radial fan zone that is located adjacent the third radial fan zone and that includes a fourth fan blade density that is greater than the third fan blade density and that is provided by at least a fourth portion of the plurality of fan blades, wherein the fourth portion of the plurality of fan blades extend from the fan base toward the central fan hub.

9. The IHS of claim 7, wherein the plurality of fan blades that include the first portion that is located in the first radial fan zone are also located in the second radial fan zone and the third radial fan zone.

10. The IHS of claim 9, wherein the plurality of fan blades that include at least the second portion that is located in the second radial fan zone are also located in the third radial fan zone.

11. The IHS of claim 7, wherein the fan chassis defines an air inlet that is located axially adjacent the first radial fan zone, and wherein the fan chassis defines an air outlet that is located radially adjacent the third radial fan zone and adjacent the heat producing component.

12. The IHS of claim 7, wherein the plurality of fan blades that include at least a portion that is located in the first radial fan zone extend from the central fan hub.

13. The IHS of claim 7, wherein the first portion of the plurality of fan blades are located in the first radial fan zone, the second portion of the plurality of fan blades that are separate from the first portion of the plurality of fan blades are located in the second radial fan zone, and the third portion of the plurality of fan blades that are separate from the first portion and the second portion of the plurality of fan blades are located in the third radial fan zone.

14. A method for providing an airflow, comprising:
  rotating a fan that is located in a fan chassis and that includes a plurality of fan blades;
  drawing air, in response to rotating the fan, through an air inlet defined by the fan chassis and axially into a first radial fan zone that is provided on the fan and that includes a first fan blade density provided by at least a portion of the plurality of fan blades that are located in the first radial fan zone;
  moving, in response to rotating the fan, the air radially from the first radial fan zone to a second radial fan zone that is located radially adjacent the first radial fan zone and that includes a second fan blade density that is greater than the first fan blade density and that is provided by at least a portion of the plurality of fan blades that are located in the second radial fan zone; and
  moving, in response to rotating the fan, the air radially from the second radial fan zone to a third radial fan zone that is located radially adjacent the second radial fan zone and that includes a third fan blade density that is greater than the second fan blade density and that is provided by at least a portion of the plurality of fan blades that are located in the third radial fan zone.

15. The method of claim 14, further comprising:
  moving, in response to rotating the fan, the air radially from the third radial fan zone to a fourth radial fan zone that is located radially adjacent the third radial fan zone and that includes a fourth fan blade density that is greater than the third fan blade density and that is provided by at least a portion of the plurality of fan blades that are located in the fourth radial fan zone.

16. The method of claim 14, wherein the plurality of fan blades that include at least a portion that is located in the first radial fan zone are also located in the second radial fan zone and the third radial fan zone.

17. The method of claim 14, wherein the plurality of fan blades that include at least a portion that is located in the second radial fan zone are also located in the third radial fan zone.

18. The method of claim 14, wherein the fan chassis defines an air inlet that is located axially adjacent the first radial fan zone, and wherein the fan chassis defines an air outlet that is located radially adjacent the third radial fan zone and adjacent a heat producing component.

19. The method of claim 14, wherein the fan includes a central fan hub, and wherein the plurality of fan blades that include at least a portion that is located in the first radial fan zone extend from the central fan hub.

20. The method of claim 14, wherein a first subset of the plurality of fan blades are located in the first radial fan zone, a second subset of the plurality of fan blades that are separate from the first subset of the plurality of fan blades are located in the second radial fan zone, and a third subset of the plurality of fan blades that are separate from the first subset and the second subset of the plurality of fan blades are located in the third radial fan zone.

* * * * *